(12) United States Patent
Kikuchi

(10) Patent No.: US 12,461,455 B2
(45) Date of Patent: Nov. 4, 2025

(54) CLEANING METHOD, COMPUTER STORAGE MEDIUM, AND SUBSTRATE TREATMENT SYSTEM

(71) Applicant: Tokyo Electron Limited, Tokyo (JP)

(72) Inventor: Hayato Kikuchi, Boise, ID (US)

(73) Assignee: Tokyo Electron Limited, Tokyo (JP)

( * ) Notice: Subject to any disclaimer, the term of this patent is extended or adjusted under 35 U.S.C. 154(b) by 188 days.

(21) Appl. No.: 18/346,419

(22) Filed: Jul. 3, 2023

(65) Prior Publication Data

US 2025/0013159 A1 Jan. 9, 2025

(51) Int. Cl.
*G03F 7/00* (2006.01)
*H01L 21/02* (2006.01)
*H01L 21/67* (2006.01)

(52) U.S. Cl.
CPC ...... *G03F 7/70916* (2013.01); *G03F 7/70925* (2013.01); *H01L 21/02057* (2013.01); *H01L 21/67051* (2013.01); *H01L 21/67253* (2013.01)

(58) Field of Classification Search
CPC ............. G03F 7/70916; G03F 7/70925; G03F 7/70341; G03F 7/16; G03F 7/26; B08B 9/032; B08B 9/0325; H01L 21/02057; H01L 21/67051; H01L 21/67253
See application file for complete search history.

(56) References Cited

U.S. PATENT DOCUMENTS

2016/0236124 A1* 8/2016 Yoshida .................. B01D 35/18
2021/0157237 A1* 5/2021 Hayashi .................. B05C 11/08

FOREIGN PATENT DOCUMENTS

JP 2003-218022 A 7/2003

* cited by examiner

*Primary Examiner* — Steven H Whitesell
(74) *Attorney, Agent, or Firm* — Posz Law Group, PLC

(57) ABSTRACT

A method for cleaning a supply flow path connected to a discharger which discharges a treatment solution to a substrate, includes: (A) supplying a cleaning solution to the discharger via the supply flow path and discharging the cleaning solution from the discharger; and (B) estimating whether or not cleaning has been completed, based on a detection result by a foreign substance detector configured to detect foreign substances in the cleaning solution supplied to the supply flow path. The (B) includes: (C) estimating a cleaning completion point where the detection result by the foreign substance detector when a total discharge amount of the cleaning solution increases stabilizes, based on a history of the detection result by the foreign substance detector; and (D) estimating whether or not the cleaning has been completed, based on the estimated cleaning completion point.

20 Claims, 7 Drawing Sheets

CLEANING METHOD, COMPUTER STORAGE MEDIUM, AND SUBSTRATE TREATMENT SYSTEM

TECHNICAL FIELD

This disclosure relates to a cleaning method, a computer storage medium, and a substrate treatment system.

BACKGROUND

Japanese Laid-open Patent Publication No. 2003-218022 discloses that in order to eliminate defects caused by the presence of air bubbles in the resist supply pipe connected to the resist nozzle or particles in the resist, a dummy dispensing of the resist nozzle is performed with detecting the above air bubbles or particles.

SUMMARY

An aspect of this disclosure is a method for cleaning a flow path connected to a discharger which discharges a treatment solution to a substrate, the method including: (A) supplying a cleaning solution to the discharger via the flow path and discharging the cleaning solution from the discharger; and (B) estimating whether or not cleaning has been completed, based on a detection result by a foreign substance detector configured to detect foreign substances in the cleaning solution supplied to the flow path, wherein the (B) includes: (C) estimating a cleaning completion point where the detection result by the foreign substance detector when a total discharge amount of the cleaning solution increases stabilizes, based on a history of the detection result by the foreign substance detector; and (D) estimating whether or not the cleaning has been completed, based on the estimated cleaning completion point.

DETAILED DESCRIPTION

Figure 1:
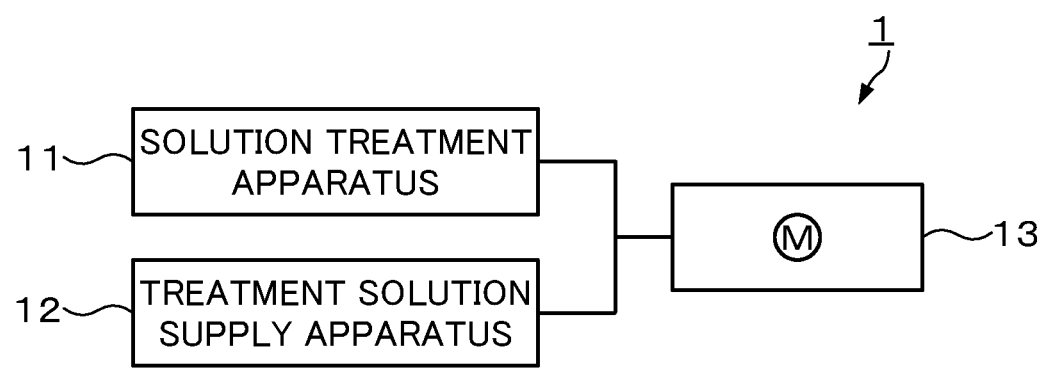
FIG. 1 is a diagram schematically illustrating the outline of a configuration of a coating and developing system as a substrate treatment system according to an embodiment.

In the photolithography step in a manufacturing process of a semiconductor device or the like, a treatment solution such as a resist solution, a developing solution or the like is used for forming a coating film such as a resist film or the like on a substrate such as a semiconductor wafer (hereinafter, referred to as a "wafer") or for developing the resist film after exposure. In a solution treatment apparatus for performing a treatment on the substrate with the treatment solution, the treatment solution is discharged to the substrate from a discharge nozzle as a discharger. To the discharge nozzle, the treatment solution is supplied via a supply flow path.

The treatment solution from the discharge nozzle sometimes contains foreign substances (particles). Besides, even if no foreign substances are present in the original treatment solution, foreign substances may be mixed into the treatment solution discharged from the discharge nozzle if the foreign substances adhere to the inside of the supply flow path connected to the discharge nozzle. Therefore, a filter is interposed in the supply flow path to the discharge nozzle, so that the foreign substances are removed by the filter.

Incidentally, even if the filter is provided, foreign substances generated in the supply flow path on the downstream side from the filter cannot be removed. For this and other reasons, dummy dispensing of discharging a cleaning solution from the discharge nozzle via the supply flow path to clean the supply flow path and the like is performed before operation of the solution treatment apparatus or the like. However, a technology relating to conventional dummy dispensing has room for improvement in terms of convenience. For example, conventionally, the dummy dispensing is performed until a predetermined amount of cleaning solution is made to pass, then the amount of foreign substances in the cleaning solution discharged from the discharge nozzle is detected by an apparatus provided outside a substrate treatment system equipped with the solution treatment apparatus, and thereafter the dummy dispensing and the detection of the amount of foreign substances using the apparatus outside the system are alternately performed until the amount of foreign substances becomes a predetermined value or less. This method may require a large amount of cleaning solution and a long time for the cleaning of the supply flow path.

Hence, the technique according to this disclosure improves the convenience when cleaning with a cleaning solution a supply flow path connected to a discharger which discharges a treatment solution to a substrate.

Hereinafter, a cleaning method and a control apparatus of a treatment solution supply apparatus according to an embodiment will be explained while referring to the drawings. Note that, in the description, components having substantially the same functional configurations are denoted by the same reference signs to omit duplicate explanations.

<Coating and Developing System>

FIG. 1 is a diagram schematically illustrating the outline of a configuration of a coating and developing system as a substrate treatment system according to an embodiment.

A coating and developing system 1 in FIG. 1 is a semiconductor manufacturing apparatus, specifically, is intended to form a resist film on the wafer as the substrate, develop the resist film after exposure, heat the wafer before exposure, heat the wafer after exposure, and so on.

For example, the coating and developing system 1 includes a solution treatment apparatus 11, a treatment solution supply apparatus 12, and a control apparatus 13.

The solution treatment apparatus 11 includes a resist film forming apparatus which applies a resist as the treatment solution on the wafer to form a resist film, a developing apparatus which supplies a developing solution as the treatment solution on the wafer after exposure to develop the resist film on the wafer, or the like.

Each solution treatment apparatus 11 has a spin chuck (see a reference sign 11a in FIG. 2 explained below) as a holder which holds the wafer, and a discharge nozzle (see a reference sign 11b in FIG. 2 explained below) as a discharger which discharges the treatment solution to the wafer. Specifically, the spin chuck rotatably holds the wafer. Specifically, the discharge nozzle discharges the treatment solution to the wafer held on the spin chuck.

Further, each solution treatment apparatus 11 applies the treatment solution to the wafer by the spin coating method. The spin coating method discharges the treatment solution to the wafer from the discharge nozzle and rotates the wafer to diffuse the treatment solution over the front surface of the wafer.

For each solution treatment apparatus, a publicly-known configuration can be used.

The treatment solution supply apparatus 12 supplies the treatment solution to the discharge nozzle of the solution treatment apparatus 11. This discharges the treatment solution from the discharge nozzle. The concrete configuration of the treatment solution supply apparatus 12 will be explained later.

The control apparatus 13 controls at least the treatment solution supply apparatus 12. The control apparatus 13 may serve also as a control apparatus which controls the whole coating and developing system 1. Further, the control apparatus 13 may constitute a part of the treatment solution supply apparatus 12.

Further, the control apparatus 13 is a computer including, for example, a processor such as a CPU, a memory and so on, and has a program storage (not illustrated) which stores programs including commands to be executed by the processor. The program storage stores a program including a command to supply the treatment solution to the discharge nozzle by the treatment solution supply apparatus 12, and a program including a command to clean the later-explained supply flow path by the treatment solution supply apparatus 12. In the case where the control apparatus 13 serves also as the control apparatus which controls the whole coating and developing system 1, the program storage also stores a program including a command to perform the wafer treatment by the coating and developing system 1. Note that the above programs may be the ones recorded in a computer-readable storage medium M and installed from the storage medium M into the control apparatus 13. The storage medium M may be a transitorily storing one or a non-transitorily storing one.

Note that the coating and developing system 1 is provided with a cassette station (not illustrated) and a wafer transfer mechanism (not illustrated). Into/out of the cassette station, a cassette housing a plurality of wafers is transferred. Further, the wafer transfer mechanism is used for wafer transfer between the cassette station and each kind of treatment apparatus, wafer transfer between various kinds of treatment apparatuses, and so on.

<Treatment Solution Supply Apparatus 12>

Figure 2:
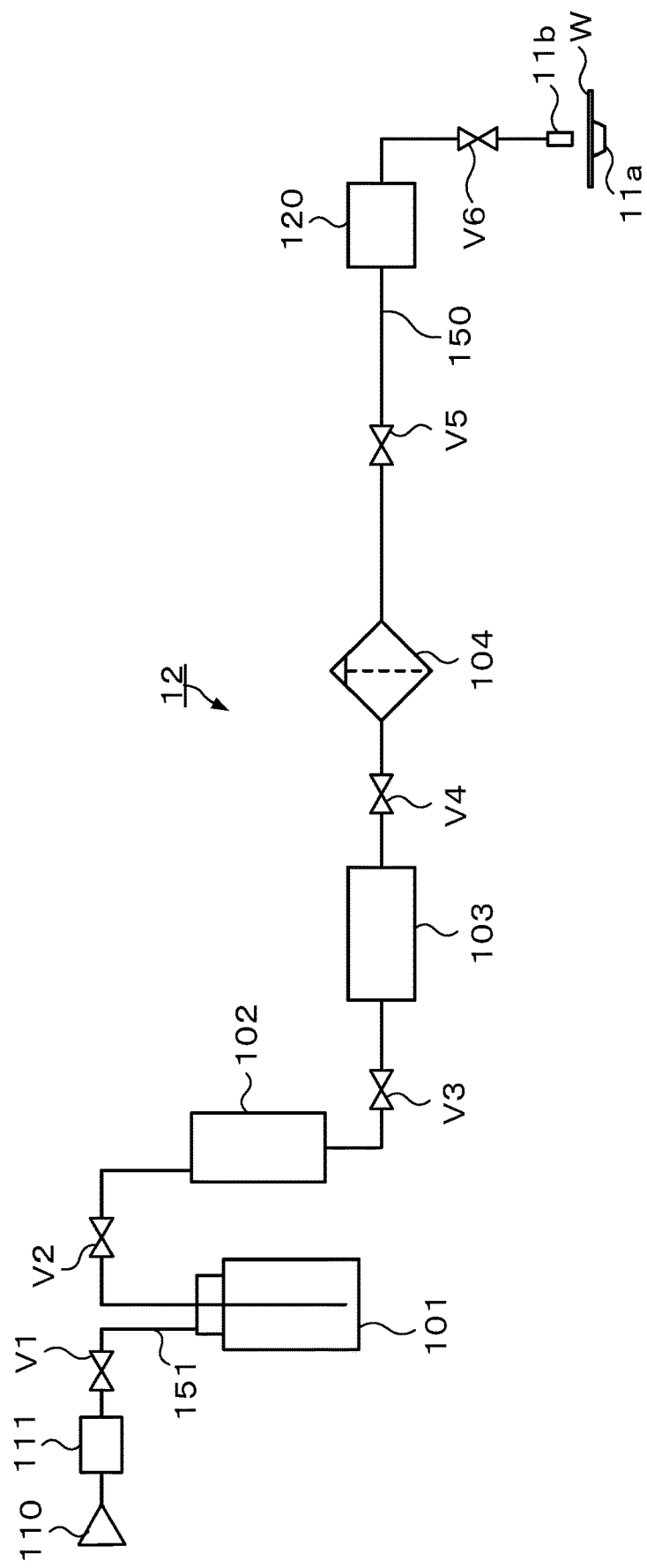
FIG. 2 is an explanatory view illustrating the outline of a configuration of a treatment solution supply apparatus.

FIG. 2 is an explanatory view illustrating the outline of a configuration of the treatment solution supply apparatus 12.

The treatment solution supply apparatus 12 in FIG. 2 supplies the treatment solution to the discharge nozzle 11b of the solution treatment apparatus 11 as explained above. The treatment solution supplied from the treatment solution supply apparatus 12 and discharged from the discharge nozzle 11b may differ according to the discharge nozzle 11b and is, for example, a resist solution, a developing solution, or the like.

The treatment solution supply apparatus 12 includes a supply flow path 150 connected to the discharge nozzle 11b. The supply flow path 150 has, for example, one end connected to the discharge nozzle 11b and another end connected to a treatment solution bottle 101 as a treatment solution supply source.

The treatment solution bottle 101 stores the treatment solution therein and is replaceable. To the treatment solution bottle 101, a supply flow path 151 with an opening/closing valve V1 interposed therein is also connected. The supply flow path 151 connects a gas supply source 110 as a supply source of an inert gas such as a nitrogen gas and the treatment solution bottle 101, and is provided with an electropneumatic regulator 111 for pressure regulation on the upstream side of the opening/closing valve V1.

Note that in place of the treatment solution bottle 101, a storage source of the treatment solution constituting the facility in a factory, in which the coating and developing system 1 is installed, may be used.

The supply flow path 150 has a buffer tank 102, a pump 103, and a filter 104 interposed therein in this order from the upstream side.

Between the treatment solution bottle 101 and the buffer tank 102 in the supply flow path 150, an opening/closing valve V2 is interposed. Further, between the buffer tank 102 and the pump 103 in the supply flow path 150, an opening/closing valve V3 is interposed. Further, between the pump 103 and the filter 104 in the supply flow path 150, an opening/closing valve V4 is interposed. Furthermore, between the filter 104 and the discharge nozzle 11b in the supply flow path 150, an opening/closing valve V5 and a supply control valve V6 are interposed in this order from the upstream side.

The buffer tank 102 is a storage portion which stores the treatment solution to be transported from the treatment solution bottle 101 and sent to the pump 103. The buffer tank 102 is provided with a liquid level sensor (not illustrated) which detects the storage remaining amount, the opening/closing valves V1, V2 are opened/closed according to the detection result by the liquid level sensor to start/stop the supply, namely, replenishment of the treatment solution from the treatment solution bottle 101 to the buffer tank 102.

The pump 103 pressure-sends the treatment solution. The pump 103 is, for example, a variable displacement pump, more specifically, a diaphragm pump. The pump 103 may be configured to suck the treatment solution from the buffer tank 102.

The filter 104 filtrates the treatment solution to remove foreign substances. Specifically, the filter 104 filtrates the treatment solution sent from the pump 103 to remove foreign substances in the treatment solution.

Further, the treatment solution supply apparatus 12 has a foreign substance detector 120 which detects foreign substances in the treatment solution supplied to the supply flow path 150. The foreign substance detector 120 is provided, for example, on the downstream side of the filter 104 in the supply flow path 150, specifically, provided between the opening/closing valve V5 and the supply control valve V6 in the supply flow path 150.

For the foreign substance detector 120, a publicly-known configuration can be used. For example, the foreign substance detector 120 has an irradiator (not illustrated) which irradiates the treatment solution flowing through the supply flow path 150 with light, a light receiver (not illustrated) which receives light radiated from the irradiator and reflected by foreign substances in the treatment solution flowing through the supply flow path 150, and a controller (not illustrated) which detects the foreign substances based on the light reception result by the light receiver. The controller of the foreign substance detector 120 is, for example, a control board on which a processor such as a CPU is mounted. Further, the controller of the foreign substance detector 120 concretely calculates, namely, detects the number of foreign substances based on the light reception result by the light receiver.

The detection result by the foreign substance detector 120 (specifically, the measurement result of the amount of foreign substances by the foreign substance detector 120) is output to the control apparatus 13. The detection result by the foreign substance detector 120 output to the control apparatus 13 is concretely a detection signal corresponding to the detection result, more specifically, a detection signal of intensity corresponding to the amount of detected foreign substances.

For each of the valves provided in the treatment solution supply apparatus 12, an electromagnetic valve or an air-operated valve which is controllable by the control apparatus 13 is used, and each valve and the control apparatus 13 are electrically connected. Further, the control apparatus 13 is electrically connected to the pump 103. This configuration makes it possible that the discharge of the treatment solution by the treatment solution supply apparatus 12 and the cleaning of the supply flow path 150 are automatically performed under the control of the control apparatus 13.

<Normal Discharge Operation of the Treatment Solution Supply Apparatus 12>

Figure 3:
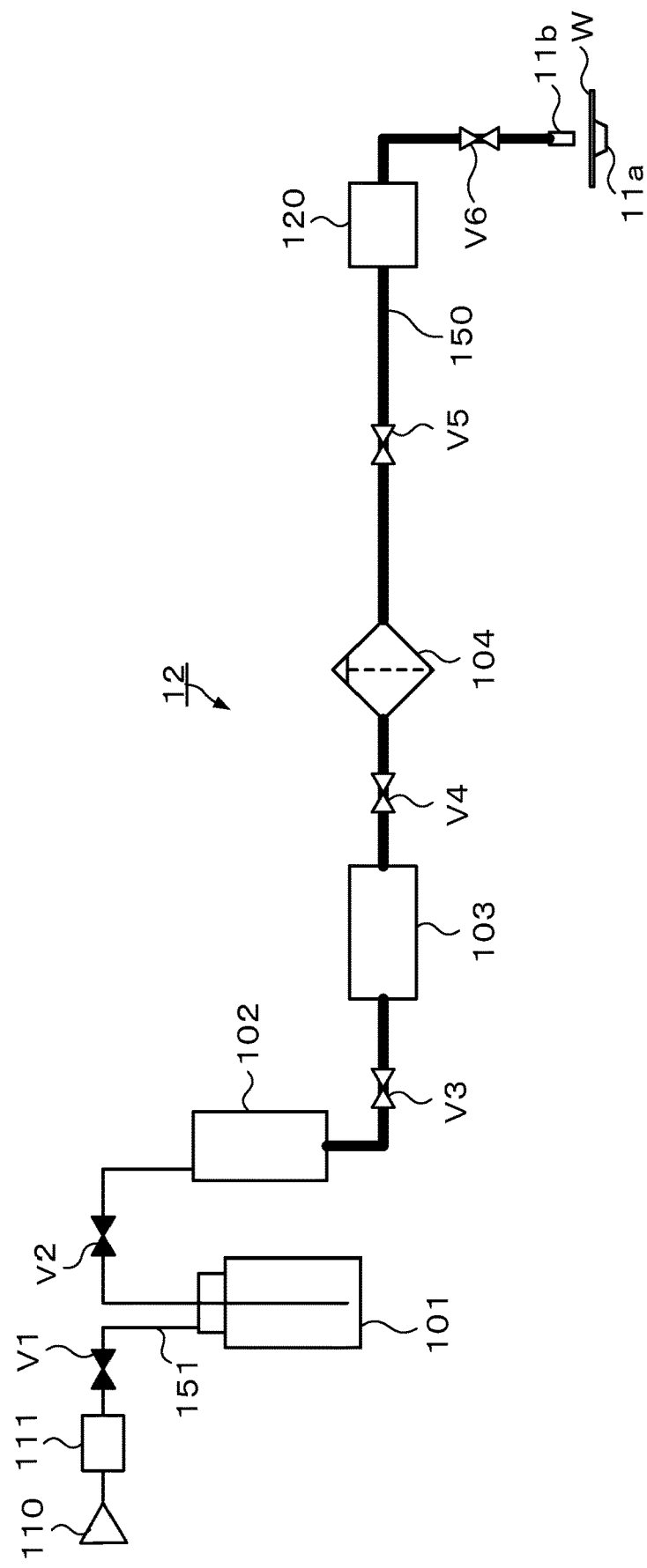
FIG. 3 is a diagram illustrating a state of the treatment solution supply apparatus during a normal discharge operation.

Next, a normal discharge operation of the treatment solution supply apparatus 12 will be explained based on FIG. 3. FIG. 3 is a diagram illustrating a state of the treatment solution supply apparatus 12 during the normal discharge operation. In FIG. 3, a valve in an open state is indicated in white, a valve in a closed state is indicated in black, and a pipe through which the treatment solution flows is indicated by a thick line. This also applies to FIG. 5 explained later. Note that it is assumed that the supply flow path 150 is filled in advance with the treatment solution before the normal discharge operation explained below.

In the normal discharge of discharging the treatment solution from the discharge nozzle 11b to a product wafer W, the opening/closing valves V3 to V5 and the supply control valve V6 are brought into an open state and the pump 103 is driven by the control of the control apparatus 13 as illustrated in FIG. 3. Thus, a predetermined amount of the treatment solution filled on the downstream side from the pump 103 in the supply flow path 150 (and the treatment solution sent from the pump 103) is supplied toward the discharge nozzle 11b, and discharged onto the product wafer W via the discharge nozzle 11b.

<Example of Cleaning of the Supply Flow Path 150 by the Treatment Solution Supply Apparatus 12>

Figure 4:
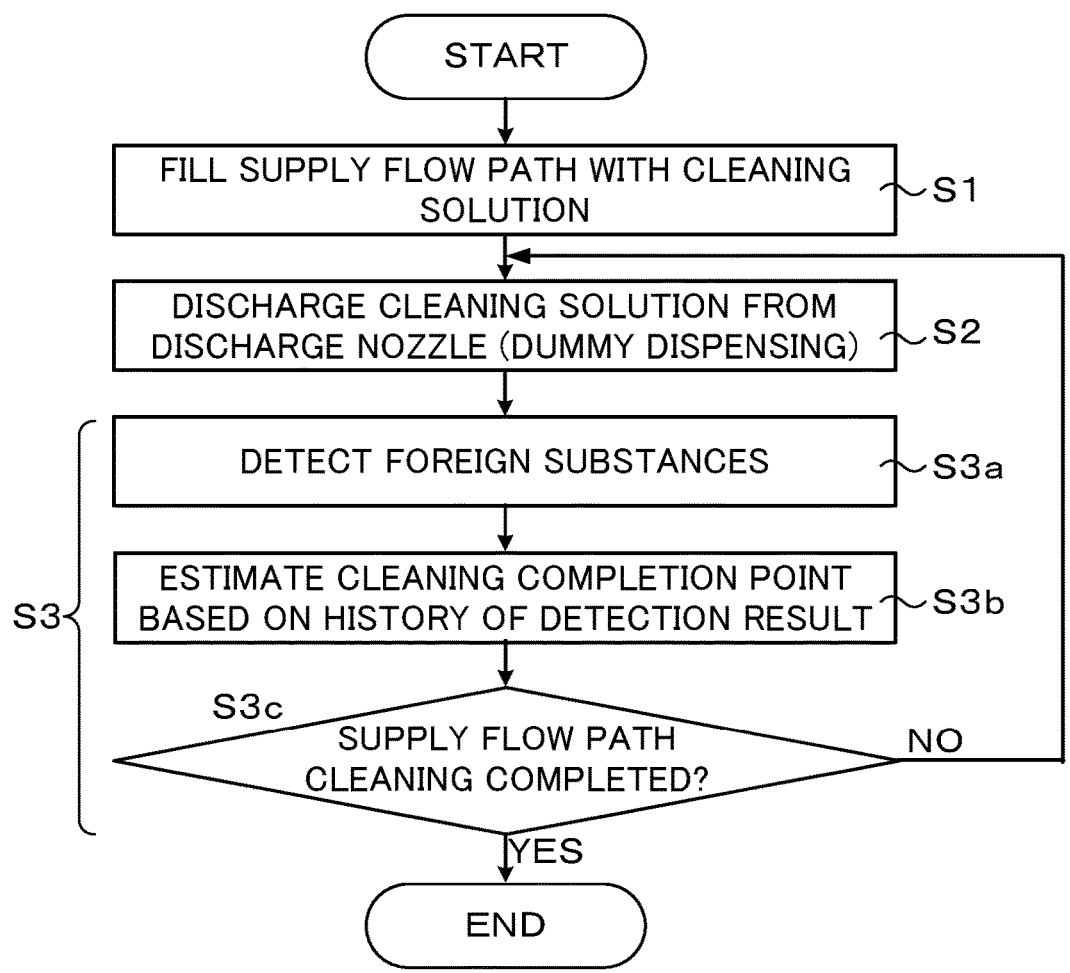
FIG. 4 is a flowchart for explaining an example of cleaning of a supply flow path by the treatment solution supply apparatus.
Figure 5:
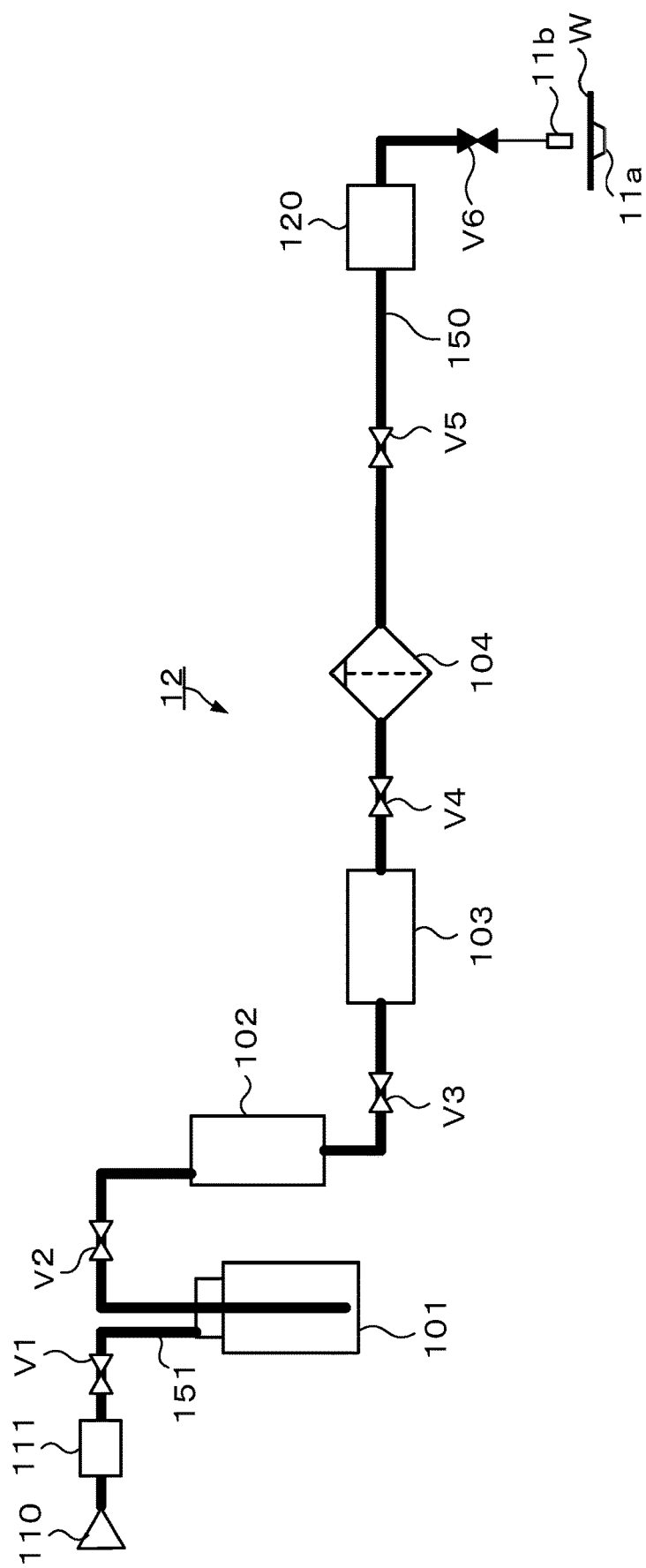
FIG. 5 is a diagram illustrating a state of the treatment solution supply apparatus during cleaning of the supply flow path.
Figure 6:
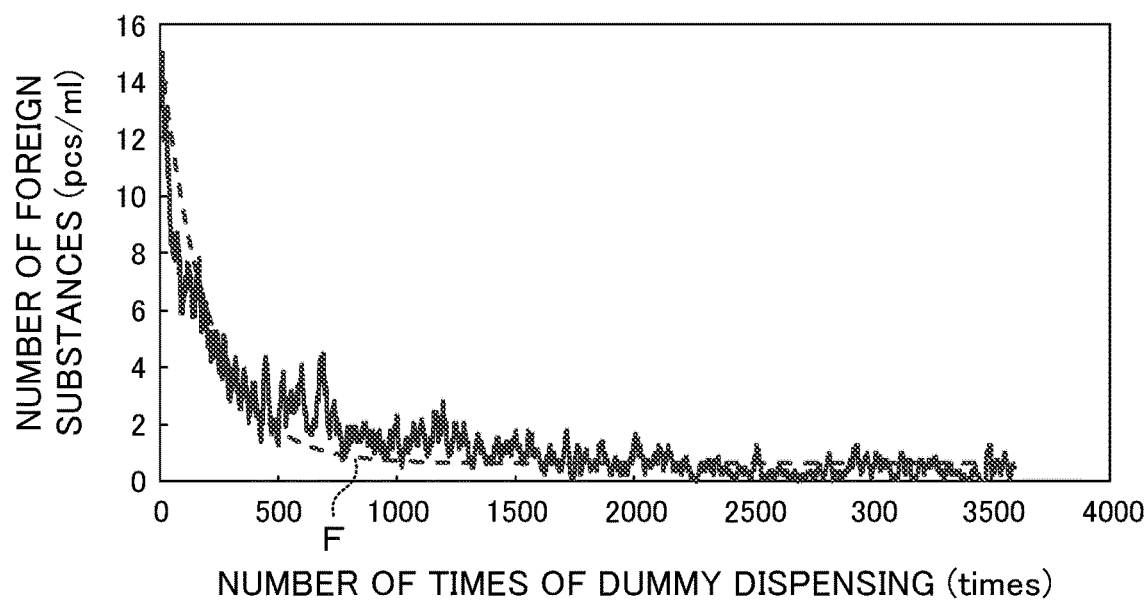
FIG. 6 is a chart illustrating an example of a detection result of a foreign substance detector during the cleaning of the supply flow path.

An example of cleaning of the supply flow path 150 by the treatment solution supply apparatus 12 will be explained based on FIG. 4 to FIG. 6. FIG. 4 is a flowchart for explaining the above example. FIG. 5 is a diagram illustrating the state of the treatment solution supply apparatus 12 during cleaning of the supply flow path 150. FIG. 6 is a chart illustrating an example of the detection result of the foreign substance detector 120 during cleaning of the supply flow path 150, that is, the result when using PGMEA as the cleaning solution. In FIG. 6, the horizontal axis represents the number of times of Step S2 corresponding to the total discharge amount of the cleaning solution from the discharge nozzle 11b, namely, the number of times of dummy dispensing, and the vertical axis represents the amount of foreign substances per 1 ml that is the detection result of the foreign substances by the foreign substance detector 120 (hereinafter abbreviated as "amount of foreign substances").

Note that the cleaning of the supply flow path 150 is performed, for example, at the start up of the treatment solution supply apparatus 12 and at the change of the kind of the treatment solution discharged from the discharge nozzle 11b.

(Step S1)

For example, first, the supply flow path 150 is filled with the cleaning solution as illustrated in FIG. 4 under the control of the control apparatus 13.

The cleaning solution is a treatment solution supplied to the discharge nozzle 11b via the supply flow path 150 after the cleaning of the supply flow path 150 or a chemical solution suitable for cleaning other than the above treatment solution.

In the case where the cleaning solution is the above treatment solution, the opening/closing valves V1 to V5 are brought into an open state, for example, as illustrated in FIG. 5 at this Step S1. Then, the treatment solution bottle 101 is pressurized with the pressure of the inert gas supplied from the gas supply source 110. Thus, the treatment solution (namely, the cleaning solution) is sent from the inside of the treatment solution bottle 101, and the supply flow path 150 from the treatment solution bottle 101 to the supply control valve V6 is filled with the cleaning solution.

(Step S2)

Next, under the control of the control apparatus 13, the supply of the cleaning solution to the discharge nozzle 11b via the supply flow path 150 is performed to discharge the cleaning solution from the discharge nozzle 11b. In other words, the dummy dispensing is performed.

Specifically, as in the above normal discharge, the opening/closing valves V1, V2 are brought into a closed state, the opening/closing valves V3 to V5 and the supply control valve V6 are brought into an open state and the pump 103 is driven by the control of the control apparatus 13. Thus, a predetermined amount of the cleaning solution filled on the downstream side from the pump 103 in the supply flow path 150 (and the cleaning solution sent from the pump 103) is supplied toward the discharge nozzle 11b and is discharged via the discharge nozzle 11b.

(Step S3)

Further, the control apparatus 13 estimates whether or not the cleaning of the supply flow path 150 has been completed, based on the detection result by the foreign substance detector 120 of the foreign substances in the cleaning solution supplied to the supply flow path 150.

This Step S3 includes Steps S3a, S3b, S3c. Note that as is clear from FIG. 4, Step S2, namely, the dummy dispensing, and Step S3 can be repeatedly performed.

(Step S3a)

At this step, under the control of the control apparatus 13, the detection of the foreign substances in the cleaning solution supplied to the supply flow path 150 is performed by the foreign substance detector 120.

Specifically, at the discharge of the cleaning solution from the discharge nozzle 11b at Step S2, the detection of the foreign substances by the foreign substance detector 120 is performed.

The detection result of the foreign substances by the foreign substance detector 120 is output to the control apparatus 13. The detection result output to the control apparatus 13 is stored in a storage (not illustrated) together with (information on) the total discharge amount of the cleaning solution until a point in time when the detection result is obtained, specifically, together with (information on) the number of times of Step S2, namely, the number of times of dummy dispensing performed, for example, until a point in time when the detection result is obtained. In other words, the detection result by the foreign substance detector 120 output to the control apparatus 13 is stored in the storage as a history.

(Step S3b)

After Step S3a, the control apparatus 13 estimates a cleaning completion point where the detection result by the foreign substance detector 120 when the total discharge amount of the cleaning solution stabilizes, based on the history of the detection result by the foreign substance detector 120.

As illustrated in FIG. 6, as the total discharge amount of the cleaning solution increases, concretely, as the number of times of dummy dispensing increases, when the number of times is small, the number of foreign substances detected by the foreign substance detector 120 remarkably reduces, whereas when the number of times is large and the cleanliness of the supply flow path 150 increases, the number of foreign substances comes to reduce rarely or not at all, namely, stabilizes.

Therefore, the control apparatus 13 estimates the cleaning completion point as explained above, and estimates whether or not the cleaning of the supply flow path 150 has been completed based on the estimated cleaning completion point as will be explained later.

The control apparatus 13 concretely performs the estimation of the cleaning completion point as follows.

More specifically, the control apparatus 13 approximates the history of the amount of foreign substances detected by the foreign substance detector 120 with respect to the total discharge amount of the cleaning solution using a predetermined mathematical model to acquire an approximated curve. The predetermined mathematical model is a monotonically decreasing function f(x) with the total discharge amount of the cleaning solution (concretely, the number of times of dummy dispensing) as a variable x, which is a function whose differential value gradually approaches zero, namely, a function converging to a certain value. The control apparatus 13 acquires the value to which the amount of foreign substances detected by the foreign substance detector 120 converges in the approximated curve, as the cleaning completion point, namely, estimates the value for convergence as the cleaning completion point.

More specifically, the control apparatus 13 approximates the history of the amount of foreign substances detected by the foreign substance detector 120 with respect to the total discharge amount of the cleaning solution (concretely, the number of times of dummy dispensing) using the following Equation (X) to acquire α in the following Equation (X) as the cleaning completion point, namely, to estimate a as the cleaning completion point.

$$N = (N_0 - \alpha) * (1/2)^{t/T} + \alpha \qquad (X)$$

N: the amount of foreign substances detected by the foreign substance detector $N_0$=an initial value of the amount of foreign substances detected by the foreign substance detector 120

T=the total discharge amount of the cleaning solution until the amount of foreign substances detected by the foreign substance detector 120 reduces by half t=the total discharge amount of the cleaning solution Note that a coefficient of determination (namely, goodness of fit) $R^2$ of an approximate expression F obtained by approximating the data in FIG. 6 by the above Equation (X) is 0.85 or more.

(Step S3c)

After Step S3b, the control apparatus 13 estimates whether or not the cleaning of the supply flow path 150 has been completed based on the cleaning completion point estimated at Step S3b.

Concretely, the control apparatus 13 estimates whether or not the cleaning of the supply flow path 150 has been completed, based on whether or not the number of foreign substances detected by the foreign substance detector 120 at Step S2 falls within a target range based on the cleaning completion point. The above target range is, for example, α (cleaning completion point)±1%.

Step S2, namely, the dummy dispensing, and Step S3 can be repeatedly performed, and in the case where the amount of foreign substances detected at Step S2, namely, the dummy dispensing at the most recent one time falls within the target range based on the cleaning completion point, the control apparatus 13 estimates that the cleaning of the supply flow path 150 has been completed. Besides, in the case where the amounts of foreign substances detected at the dummy dispensing at the most recent n times (n is a natural number of 2 or more) continuously fall within the target range or in case where an average value of the amounts of foreign substances detected at the dummy dispensing at the most recent n times falls within the target range, the control apparatus 13 estimates that the cleaning of the supply flow path 150 has been completed.

In the case where it is estimated that the cleaning has not been completed (in the case of NO), the control apparatus 13 returns the processing to Step S2, and executes the dummy dispensing. In this event, the control apparatus 13 appropriately executes replenishment of the cleaning solution from the treatment solution bottle 101 to the pump 103.

On the other hand, in the case where it is estimated that the cleaning has been completed (in the case of YES), a series of steps at the cleaning of the supply flow path 150 by the treatment solution supply apparatus 12 ends.

Note that in the case where it is estimated that the cleaning has been completed, the cleaning solution via the supply flow path 150 and the discharge nozzle 11b may be discharged onto a dummy wafer under the control of the control apparatus 13. The number of foreign substances in the cleaning solution discharged on the dummy wafer may be counted by an apparatus outside the coating and developing system 1. This makes it possible to determine whether or not the cleaning of the supply flow path 150 has been actually completed based on the counting result by the outside apparatus.

Further, when the estimation that the cleaning has not been completed continues a predetermined number of times or more at Step S3c, a warning representing that the cleaning has not been completed or the like may be reported by report means (not illustrated) such as display means or sound output means of the control apparatus 13.

Note that in the case where the estimated cleaning completion point is a predetermined value or more, a warning representing that abnormality occurs or the like may be reported by the report means.

Main Effect of this Embodiment

As explained above, the cleaning method of the supply flow path 150 according to this embodiment includes: supplying the cleaning solution to the discharge nozzle 11b via the supply flow path 150 and discharging the cleaning solution from the discharge nozzle 11b; and estimating whether or not the cleaning of the supply flow path 150 has been completed based on the detection result by the foreign substance detector 120 of foreign substances in the cleaning solution supplied to the supply flow path 150. Further, in the estimating, the cleaning completion point, where the detection result by the foreign substance detector 120 when the total discharge amount of the cleaning solution increases stabilizes, is estimated based on the history of the detection result by the foreign substance detector 120, and it is estimated whether or not the cleaning of the supply flow path 150 has been completed based on the cleaning completion point. Therefore, it is possible to reach, with a small amount of cleaning solution, the degree of cleanliness of the supply flow path 150 which can be reached by the passage of the cleaning solution, namely, the dummy dispensing. Further, since the amount of cleaning solution used is small, it is possible to reduce the time when the cleaning solution is made to pass, thereby reducing the time required for the cleaning of the supply flow path 150. Further, since the detection of the number of foreign substances using the apparatus outside the coating and developing system 1 is unnecessary or the number of times of detection using the outside apparatus can be suppressed, the time required for the cleaning of the supply flow path 150 can be reduced also from those viewpoints. Therefore, according to this embodiment, it is possible to reduce the amount of the cleaning solution and the time when cleaning the supply flow path 150 with the cleaning solution and to improve the convenience at the cleaning time.

<Another Example of the Estimation of the Cleaning Completion Point>

In estimating the cleaning completion point, the control apparatus 13 may exclude the amount of foreign substances exceeding a predetermined value from the history of the foreign substances detected by the foreign substance detector 120 and approximate the history after the exclusion using the above predetermined mathematical model.

The predetermined value is, for example, determined based on the amount of foreign substances detected by the foreign substance detector 120, specifically, the amount of foreign substances detected at Step S2, namely, the dummy dispensing at the first time.

In the case where not foreign substances but bubbles exist in the cleaning solution flowing through the supply flow path 150, the amount of received light by the light receiver of the foreign substance detector 120 is large and it appears as if many foreign substances are detected by the foreign substance detector 120. In other words, the bubbles are falsely detected as foreign substances. In contrast, by excluding the amount of foreign substances exceeding the predetermined value from the history of the amount of foreign substances used for the approximation as above, it is possible to prevent the estimation result of the cleaning completion point from being affected by the bubbles in the cleaning solution. As a result, it is possible to prevent the estimation result whether or not the cleaning of the supply flow path 150 has been completed from being incorrect due to the effect of the bubbles in the cleaning solution.

Note that not only the amount of foreign substances exceeding the initial value but also the amounts of foreign substances detected in the detection performed before and after the detection in which the amount of foreign substances exceeding the initial value is obtained may be excluded from the history used for the approximation.

<Operation Example when the Amount of Foreign Substance Exceeding the Predetermined Value a Plurality of Times>

The amount of foreign substance exceeding the predetermined value is sometimes detected a plurality of times until the estimation that the cleaning of the supply flow path 150 has been completed.

In this case and if the frequency of the detection of the amount of foreign substances exceeding the predetermined value by the foreign substance detector 120 does not reduce, namely, if the frequency of occurrence of bubble does not reduce, the discharge operation of the cleaning solution by the treatment solution supply apparatus 12 at Step S2 may be changed. Specifically, the discharge operation of the cleaning solution may be stopped or the flow rate of the cleaning solution may be lowered so as to make bubbles less likely to occur. In this case, a warning representing the fact that bubbles are continuously occurring or the like may be reported by the above report means. Further, in the case where the pump 103 is configured to be able to perform degassing of liquid in the pump 103, the degassing of the cleaning solution in the pump 103 may be performed after the discharge operation of the cleaning solution is stopped once, and the degassed cleaning solution may be made to pass through the supply flow path 150. Note that in the degassing, the depressurization of a storage chamber of the cleaning solution in the pump 103 and bubble removal from the storage chamber are performed.

<Modification Example of the Cleaning of the Supply Flow Path 150 by the Treatment Solution Supply Apparatus 12>

In the above example, the control apparatus 13 acquires the approximated curve every Step S2, namely, dummy dispensing, and estimates the cleaning completion point. Instead of this, the control apparatus 13 may acquire the approximated curve and estimate the cleaning completion point every time when performing the dummy dispensing m times (m is a natural number of 2 or more).

Besides, the control apparatus 13 may acquire the approximated curve and estimate the cleaning completion point based on the history of the number of detected foreign substances until an initial predetermined number of times (for example, 100 times) of the dummy dispensing, and may use the estimated cleaning completion point for estimating whether or not the cleaning has been completed at the dummy dispensing after the predetermined number of times.

In the above example, the discharge from the discharge nozzle 11*b* of the cleaning solution at Step S2 is continuously performed, namely, the dummy dispensing is repeatedly performed until the estimation that the cleaning of the supply flow path 150 has been completed. Instead of this, the dummy dispensing may be interrupted for 30 minutes or more, before the estimation that the cleaning of the supply flow path 150 has been completed. The time period when the dummy dispensing is interrupted is, for example, 30 minutes or more and 10 hours or less, but may exceed 10 hours. By this interruption, the cleaning solution may be retained in the supply flow path 150 to cause foreign substances (specifically, organic foreign substances and so on) peculiar to the time of retention, from the filter 104 interposed in the supply flow path 150. The foreign substances peculiar to the time of retention can be removed by restarting the dummy dispensing of the cleaning solution. The time period when the dummy dispensing is interrupted may, for example, be longer than the time required for one treatment by each the treatment solution supply apparatus in the coating and developing system.

The interruption for 30 minutes or more of the dummy dispensing is intermittently performed. In other words, the dummy dispensing and the interruption for 30 minutes or more of the dummy dispensing are alternately repeatedly performed a plurality of times.

Besides, whether or not the interruption is performed again is decided, for example, based on the detection result by the foreign substance detector 120, specifically, decided based on the detection results by the foreign substance detector 120 before and after the most recent interruption. More specifically, when the amount of foreign substances detected by the foreign substance detector 120 just after the interruption, namely, just after the restart of the dummy dispensing exceeds the amount of foreign substances detected by the foreign substance detector 120 just before the interruption, it is decided to perform the interruption again, and, otherwise, it is decided not to perform the interruption again.

Note that the timing of the restart of the interruption for 30 minutes or more of the dummy dispensing is, for example, as follows. Specifically, after the restart of the dummy dispensing, when the amount of foreign substances detected by the foreign substance detector 120 at the dummy dispensing falls within a predetermined range based on the most recently acquired approximated curve, the interruption is restarted. Specifically, after the restart of the dummy dispensing, when the amount of foreign substances detected by the foreign substance detector 120 at the p-th time dummy dispensing (including the dummy dispensing before the interruption) falls within ±1% of the amount of foreign substances at the p-th time in the most recently acquired approximated curve, the interruption is restarted.

The interruption time may differ every time or may gradually increase.

By performing the interruption for 30 minutes or more of the dummy dispensing (specifically, thereafter restarting the dummy dispensing), when retention of the treatment solution occurs in the supply flow path 150 after the completion of the cleaning of the supply flow path 150, it is possible to suppress the occurrence of foreign substances peculiar to the time of the retention. Also in this case, whether or not the cleaning of the supply flow path 150 has been completed is estimated based on the cleaning completion point, so that when the foreign substances peculiar to the time of retention occur due to the dummy dispensing, it is possible to reach, with a small amount of cleaning solution and in a short time, the degree of cleanliness of the supply flow path 150 which can be reached by the dummy dispensing.

Further, repeatedly performing the dummy dispensing and the interruption for 30 minutes or more of the dummy dispensing brings the filter or the like causing the foreign substances peculiar to the time of retention into a state of being less likely to cause the foreign substances, namely, brings the filter or the like into a state of not being affected by the retention. Further, whether or not to perform the interruption again is decided based on the detection result by the foreign substance detector 120, thus making it possible to suppress the number of times of the interruption required for bringing the filter or the like into a state of not being affected by the retention. Accordingly, it is possible to obtain the filter or the like in a state of not being affected by the retention in a comparatively short time.

<Another Arrangement Example of the Foreign Substance Detector>

Figure 7:
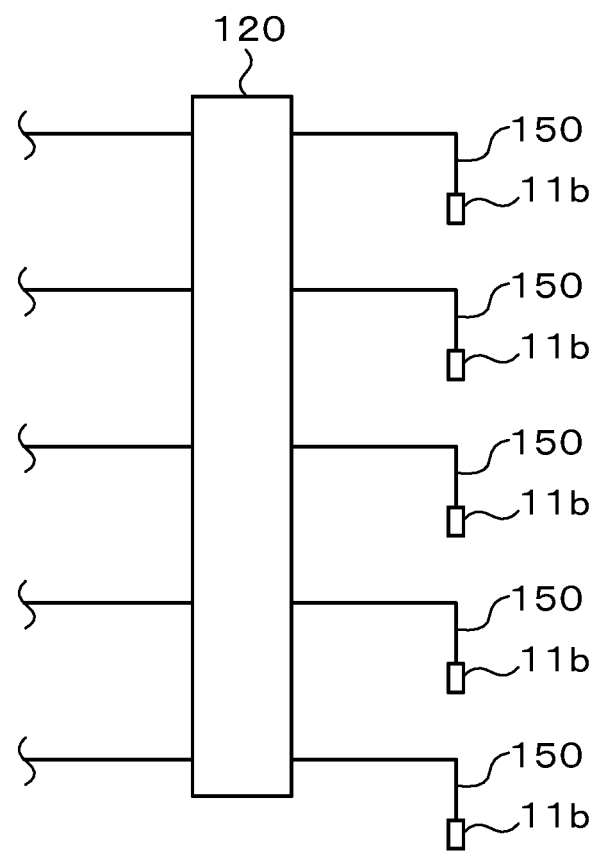
FIG. 7 is a diagram illustrating another arrangement example of the foreign substance detector.

FIG. 7 is a diagram illustrating another arrangement example of the foreign substance detector 120.

Though one foreign substance detector 120 is provided for one supply flow path 150, namely, one discharge nozzle 11b in the above example, the foreign substance detector 120 may be provided in common among a plurality of supply flow paths 150, namely, a plurality of discharge nozzles 11b as illustrated in FIG. 7. In this case, for example, the irradiator and the light receiver of the foreign substance detector 120 are configured to be movable in the arrangement direction of the plurality of supply flow paths 150.

In the case where the foreign substance detector 120 is provided in common as above and in the case where the plurality of supply flow paths 150 are cleaned at the same time, for example, the detection by the foreign substance detector 120 is performed such that the detection frequency is equal among the supply flow paths 150.

In the case were the foreign substance detector 120 is provided in common as above and in the case where the plurality of supply flow paths 150 are cleaned at the same time but the start times of the cleaning thereof differ, for example, the detection by the foreign substance detector 120 is performed such that the detection frequency is high for the supply flow path 150 which is at the initial stage of the cleaning and in which the number of detectable foreign substances is large.

Note that the estimation based on the history of the detection result by the foreign substance detector 120 in the case where the foreign substance detector 120 is provided in common as above is the same as in the case where the foreign substance detector 120 is provided for each supply flow path 150.

OTHER MODIFICATION EXAMPLES

The foreign substance detector 120 is provided in the supply flow path 150 in the above example, but may be provided in a branch flow path (not illustrated) branched from the supply flow path 150. The branch flow path is concretely branches from a portion on the downstream side from the pump 103 and the filter 104 in the supply flow path 150. Further, the branch flow path may have both ends connected to the supply flow path 150 to constitute a circulation path together with a part of the supply flow path 150 or to constitute a bypass path with respect to the supply flow path 150.

The embodiments disclosed herein are examples in all respects and should not be considered to be restrictive. Various omissions, substitutions and changes may be made in the embodiment without departing from the scope and spirit of the attached claims. For example, configuration requirements of the above embodiments can be arbitrarily combined. The operations and effects about the configuration requirements relating to the combination can be obtained as a matter of course from the arbitrary combination, and those skilled in the art can obtain clear other operations and effects from the description herein.

The effects described herein are merely explanatory or illustrative in all respects and not restrictive. The technique relating to this disclosure can offer other clear effects to those skilled in the art from the description herein in addition to or in place of the above effects.

Note that the following configuration examples also belong to the technical scope of this disclosure.

(1) A method for cleaning a supply flow path connected to a discharger which discharges a treatment solution to a substrate, the method including:
   (A) supplying a cleaning solution to the discharger via the supply flow path and discharging the cleaning solution from the discharger; and
   (B) estimating whether or not cleaning has been completed, based on a detection result by a foreign substance detector configured to detect foreign substances in the cleaning solution supplied to the supply flow path, wherein the (B) includes:

(C) estimating a cleaning completion point where the detection result by the foreign substance detector when a total discharge amount of the cleaning solution increases stabilizes, based on a history of the detection result by the foreign substance detector; and (D) estimating whether or not the cleaning has been completed, based on the estimated cleaning completion point.

(2) The cleaning method according to the (1), wherein:

the (C) approximates a history of an amount of the foreign substances detected by the foreign substance detector using a predetermined mathematical model to acquire an approximated curve, and estimates a value to which the amount of foreign substances converges in the approximated curve as the cleaning completion point; and the (D) determines whether or not the cleaning has been completed, based on whether or not the amount of foreign substances detected by the foreign substance detector falls within a target range based on the cleaning completion point.

(3) The cleaning method according to the (2), wherein the predetermined mathematical model is represented by following Equation (X), $$N = (N_0 - \alpha) * (1/2)^{t/T} + \alpha \qquad (X)$$

N: the amount of foreign substances detected by the foreign substance detector $N_0$=an initial value of the amount of foreign substances detected by the foreign substance detector T=the total discharge amount of the cleaning solution until the amount of foreign substances detected by the foreign substance detector reduces by half t=the total discharge amount of the cleaning solution $\alpha$=the cleaning completion point.

(4) The cleaning method according to the (2) or (3), wherein at the approximation in the (C), the amount of foreign substances exceeding a predetermined value is excluded from the history of the amount of foreign substances detected by the foreign substance detector, and the history after the exclusion is approximated using the predetermined mathematical model.

(5) The cleaning method according to the (4), wherein if a frequency of the detection of the amount of foreign substances exceeding the predetermined value does not reduce, a discharge operation of the cleaning solution in the discharging is changed.

(6) The cleaning method according to any one of the (1) to (5), further including interrupting the (A) for 30 minutes or more before the estimation that the cleaning has been completed in the (B).

(7) The cleaning method according to the (6), wherein the (A) and the interruption for 30 minutes or more of the (A) are alternately performed a plurality of times.

(8) A non-transitory computer-readable storage medium storing a program running on a computer of a control apparatus for controlling a treatment solution supply apparatus to cause the treatment solution supply apparatus to execute a method for cleaning a supply flow path connected to a discharger which discharges a treatment solution to a substrate, the treatment solution supply apparatus having the supply flow path, the method including:

(A) supplying a cleaning solution to the discharger via the supply flow path and discharging the cleaning solution from the discharger; and (B) estimating whether or not cleaning has been completed, based on a detection result by a foreign substance detector configured to detect foreign substances in the cleaning solution supplied to the supply flow path, wherein the (B) includes:

(C) estimating a cleaning completion point where the detection result by the foreign substance detector when a total discharge amount of the cleaning solution increases stabilizes, based on a history of the detection result by the foreign substance detector; and (D) estimating whether or not the cleaning has been completed, based on the estimated cleaning completion point.

(9) A control apparatus of a treatment solution supply apparatus for supplying a treatment solution to a discharger which discharges the treatment solution to a substrate, the treatment solution supply apparatus having a supply flow path connected to the discharger, the control apparatus controlling the treatment solution supply apparatus to execute:

(A) supplying a cleaning solution to the discharger via the supply flow path and discharging the cleaning solution from the discharger; and (B) estimating whether or not cleaning has been completed, based on a detection result by a foreign substance detector configured to detect foreign substances in the cleaning solution supplied to the supply flow path, wherein the (B) includes:

(C) estimating a cleaning completion point where the detection result by the foreign substance detector when a total discharge amount of the cleaning solution increases stabilizes, based on a history of the detection result by the foreign substance detector; and (D) estimating whether or not the cleaning has been completed, based on the estimated cleaning completion point.

According to this disclosure, it is possible to improve the convenience when cleaning with a cleaning solution a supply flow path connected to a discharger which discharges a treatment solution to a substrate.

What is claimed is:

1. A method for cleaning a supply flow path connected to a discharger which discharges a treatment solution to a substrate, the method comprising:

(A) supplying a cleaning solution to the discharger via the supply flow path and discharging the cleaning solution from the discharger; and (B) estimating whether or not cleaning has been completed, based on a detection result by a foreign substance detector configured to detect foreign substances in the cleaning solution supplied to the supply flow path, wherein the (B) comprises:

(C) estimating a cleaning completion point where the detection result by the foreign substance detector stabilizes as a total discharge amount of the cleaning solution is increasing, based on a history of the detection result by the foreign substance detector; and (D) estimating whether or not the cleaning has been completed, based on the estimated cleaning completion point.

2. The cleaning method according to claim 1, wherein:

the (C) approximates a history of an amount of the foreign substances detected by the foreign substance detector using a predetermined mathematical model to acquire an approximated curve, and estimates a value to which the amount of foreign substances converges in the approximated curve as the cleaning completion point; and the (D) determines whether or not the cleaning has been completed, based on whether or not the amount of foreign substances detected by the foreign substance detector falls within a target range based on the cleaning completion point.

3. The cleaning method according to claim 2, wherein the predetermined mathematical model is represented by following Equation (X), $$N = (N_0 - \alpha) * (1/2)^{t/T} + \alpha \tag{X}$$

N: the amount of foreign substances detected by the foreign substance detector $N_0$=an initial value of the amount of foreign substances detected by the foreign substance detector T=the total discharge amount of the cleaning solution until the amount of foreign substances detected by the foreign substance detector reduces by half t=the total discharge amount of the cleaning solution $\alpha$=the cleaning completion point.

4. The cleaning method according to claim 2, wherein at the approximation in the (C), the amount of foreign substances exceeding a predetermined value is excluded from the history of the amount of foreign substances detected by the foreign substance detector, and the history after the exclusion is approximated using the predetermined mathematical model.

5. The cleaning method according to claim 4, wherein if a frequency of the detection of the amount of foreign substances exceeding the predetermined value does not reduce, a discharge operation of the cleaning solution in the discharging is changed.

6. The cleaning method according to claim 1, further comprising interrupting the (A) for 30 minutes or more before the estimation that the cleaning has been completed in the (B).

7. The cleaning method according to claim 6, wherein the (A) and the interruption for 30 minutes or more of the (A) are alternately performed a plurality of times.

8. A non-transitory computer-readable storage medium storing a program running on a computer of a control apparatus for controlling a treatment solution supply apparatus to cause the treatment solution supply apparatus to execute a method for cleaning a supply flow path connected to a discharger which discharges a treatment solution to a substrate, the treatment solution supply apparatus having the supply flow path, the method comprising:

(A) supplying a cleaning solution to the discharger via the supply flow path and discharging the cleaning solution from the discharger; and (B) estimating whether or not cleaning has been completed, based on a detection result by a foreign substance detector configured to detect foreign substances in the cleaning solution supplied to the supply flow path, wherein the (B) comprises:

(C) estimating a cleaning completion point where the detection result by the foreign substance detector stabilizes as a total discharge amount of the cleaning solution is increasing, based on a history of the detection result by the foreign substance detector; and (D) estimating whether or not the cleaning has been completed, based on the estimated cleaning completion point.

9. The non-transitory computer-readable storage medium according to claim 8, wherein:

the (C) approximates a history of an amount of the foreign substances detected by the foreign substance detector using a predetermined mathematical model to acquire an approximated curve, and estimates a value to which the amount of foreign substances converges in the approximated curve as the cleaning completion point; and the (D) determines whether or not the cleaning has been completed, based on whether or not the amount of foreign substances detected by the foreign substance detector falls within a target range based on the cleaning completion point.

10. The non-transitory computer-readable storage medium according to claim 9, wherein the predetermined mathematical model is represented by following Equation (X), $$N = (N_0 - \alpha) * (1/2)^{t/T} + \alpha \tag{X}$$

N: the amount of foreign substances detected by the foreign substance detector $N_0$=an initial value of the amount of foreign substances detected by the foreign substance detector T=the total discharge amount of the cleaning solution until the amount of foreign substances detected by the foreign substance detector reduces by half t=the total discharge amount of the cleaning solution $\alpha$=the cleaning completion point.

11. The non-transitory computer-readable storage medium according to claim 9, wherein at the approximation in the (C), the amount of foreign substances exceeding a predetermined value is excluded from the history of the amount of foreign substances detected by the foreign substance detector, and the history after the exclusion is approximated using the predetermined mathematical model.

12. The non-transitory computer-readable storage medium according to claim 11, wherein if a frequency of the detection of the amount of foreign substances exceeding the predetermined value does not reduce, a discharge operation of the cleaning solution in the discharging is changed.

13. The non-transitory computer-readable storage medium according to claim 8, further comprising interrupting the (A) for 30 minutes or more before the estimation that the cleaning has been completed in the (B).

14. The non-transitory computer-readable storage medium according to claim 13, wherein the (A) and the interruption for 30 minutes or more of the (A) are alternately performed a plurality of times.

15. A control apparatus of a treatment solution supply apparatus for supplying a treatment solution to a discharger which discharges the treatment solution to a substrate,
the treatment solution supply apparatus having a supply flow path connected to the discharger,
the control apparatus controlling the treatment solution supply apparatus to execute:
(A) supplying a cleaning solution to the discharger via the supply flow path and discharging the cleaning solution from the discharger; and
(B) estimating whether or not cleaning has been completed, based on a detection result by a foreign substance detector configured to detect foreign substances in the cleaning solution supplied to the supply flow path, wherein
the (B) comprises:
(C) estimating a cleaning completion point where the detection result by the foreign substance detector stabilizes as a total discharge amount of the cleaning solution is increasing, based on a history of the detection result by the foreign substance detector; and
(D) estimating whether or not the cleaning has been completed, based on the estimated cleaning completion point.

16. The control apparatus according to claim 15, wherein:
the (C) approximates a history of an amount of the foreign substances detected by the foreign substance detector using a predetermined mathematical model to acquire an approximated curve, and estimates a value to which the amount of foreign substances converges in the approximated curve as the cleaning completion point; and
the (D) determines whether or not the cleaning has been completed, based on whether or not the amount of foreign substances detected by the foreign substance detector falls within a target range based on the cleaning completion point.

17. The control apparatus according to claim 16, wherein the predetermined mathematical model is represented by following Equation (X), $$N=(N_0-\alpha)*(1/2)^{t/T}+\alpha \qquad (X)$$

N: the amount of foreign substances detected by the foreign substance detector
$N_0$=an initial value of the amount of foreign substances detected by the foreign substance detector
T=the total discharge amount of the cleaning solution until the amount of foreign substances detected by the foreign substance detector reduces by half
t=the total discharge amount of the cleaning solution
$\alpha$=the cleaning completion point.

18. The control apparatus according to claim 16, wherein at the approximation in the (C), the amount of foreign substances exceeding a predetermined value is excluded from the history of the amount of foreign substances detected by the foreign substance detector, and the history after the exclusion is approximated using the predetermined mathematical model.

19. The control apparatus according to claim 18, wherein if a frequency of the detection of the amount of foreign substances exceeding the predetermined value does not reduce, a discharge operation of the cleaning solution in the discharging is changed.

20. The control apparatus according to claim 15, further comprising
interrupting the (A) for 30 minutes or more before the estimation that the cleaning has been completed in the (B).

* * * * *